United States Patent [19]

Browne

[11] 3,909,504

[45] Sept. 30, 1975

[54] RUGGEDIZED PACKAGE FOR ELECTRONIC COMPONENTS AND THE LIKE

[75] Inventor: Sidney Browne, Falls Church, Va.

[73] Assignee: Carrier Telephone Corporation of America, Inc., Falls Church, Va.

[22] Filed: Nov. 5, 1973

[21] Appl. No.: 412,752

[52] U.S. Cl. .................. 174/52 PE; 53/30; 264/272; 317/101 R

[51] Int. Cl. .............................................. H05k 5/06

[58] Field of Search ................ 174/52 PE; 264/272; 206/497, 328, 331; 317/99, 101 R; 53/30 R, 30 S

[56] References Cited

UNITED STATES PATENTS

| | | | |
|---|---|---|---|
| 2,844,363 | 7/1958 | Clark | 174/52 PE |
| 2,863,994 | 12/1958 | Kohring | 174/52 PE |
| 2,944,170 | 7/1960 | Knapp et al. | 174/52 PE |
| 3,375,576 | 4/1968 | Klein et al. | 174/68.5 |
| 3,493,908 | 2/1970 | Byers et al. | 174/52 PE |
| 3,756,399 | 9/1973 | Cosier et al. | 174/52 PE |
| 3,809,223 | 5/1974 | Kendall | 206/497 |

*Primary Examiner*—David Smith, Jr.
*Attorney, Agent, or Firm*—Rose & Edell

[57] ABSTRACT

A temperature, moisture and shock-resistant package for electronic components includes a polyethylene bag surrounding the components. Wiring leads from the components are polyethylene-shielded and the bag opening is heat-sealed about the wiring. The leads externally of the bag are spliced and soldered to corresponding leads shielded with polyvinylchloride (PVC). The sealed bag is placed between polystyrene boards which are tied together about the bag, the boards and bag being placed in a cylindrical PVC tube. Catalyst-responsive foam fills the remainder of the tube, and PVC end caps are PVC-welded at the ends of the PVC tube. The PVC-shielded leads are run through holes in one of the end caps after being knotted inside the tube. The knots are adhesively secured to the inside surface of the end cap with PVC cement which both prevents the leads from being pulled loose and seals the wiring egress holes in the end cap.

9 Claims, 11 Drawing Figures

RUGGEDIZED PACKAGE FOR ELECTRONIC COMPONENTS AND THE LIKE

BACKGROUND OF THE INVENTION

The present invention relates to weather and shock-proof packages in general, and particularly to such packages which have specialized utility in the housing of electronic equipment which is located in an outdoor environment.

There are many classes of objects and materials which require special packaging and protection during shipping, storing or use. The embodiment of the present invention disclosed herein relates primarily to the packaging, of electronic components; however, it will be apparent to those of ordinary skill in the field of packaging, that some of the inventive concepts described herein have utility outside the electronics industry.

For example, in telephone systems it is often necessary to locate relatively sophisticated and delicate electronic equipment outdoors where it is subject to extreme weather changes. Much of this equipment is temperature-sensitive; almost all of it is subject to irreperable damage from shock and moisture. Temperature sensitivity has two aspects. First, some equipment must be maintained within a limited temperature range in order to operate as intended. Second, extreme temperature changes often affect mechanical joints and seals because of the disparity in the temperature expansion coefficient of the two parts being joined or sealed.

Moisture sensitivity, of course, relates to the effect of moisture on insulation resistance and in some cases changes in capacity between components which may render circuitry inoperative. The major problem in this regard relates to the fact that wiring must often be run to and from the electronic components through holes in the package. Although various types of packing material has been used to seal such holes in prior art packages, in many cases the packing becomes ineffective with time, particularly where the package is subject to extremes in temperature and vibration.

Electronic communications equipment, for example station carrier telephone equipment, in addition to being exposed to shock during use, is often carelessly handled during shipping and installation, resulting in significant damage. In this regard particularly common problems are the tearing loose of wiring from the components inside the package, and the damaging of components themselves.

SUMMARY OF THE INVENTION

The exterior of the package of the present invention comprises a polyvinylchloride (PVC) tube having PVC end caps joined in a PVC weld to the tube ends. The electronic components being packaged are disposed within the tube inside a sealed polyethylene bag. Wiring from components inside the bag is shielded with polyethylene, the polyethylene bag and polyethylene shielding being heat sealed at the point where the wiring egresses from the bag. Once outside the bag the wiring is spliced and soldered to corresponding wiring which is shielded with PVC. The PVC-shielded wire is knotted prior to egressing from the tube end cap and the knot is adhesively secured to the inside surface of the end cap by means of PVC cement. The knot and the cement prevents the wiring from being pulled through the end cap holes and thereby assure that the circuit connections inside the package remain secure. In addition the PVC cement seals the wiring egress holes against moisture to provide a double mositure seal along with the heat sealed polyethylene bag inside the tube. The use of PVC cement in conjunction with the PVC wire shielding at the holes in the PVC end cap results in a strong and durable mechanical seal. Specifically, since the end cap, cement and wire shield are all made from the same material, they all have the same temperature expansion coefficient and remain integral over wide ranges of temperature variation. Moreover, the similarity of the components at the joint render the joint more resistant to shock and vibration than is the case for joints between non-similar materials. Similar durability is provided by the use of the polyethylene wire shielding at the point of egress from the polyethylene bag. Likewise the use of a PVC welding material to join the PVC end caps to the PVC tubing assures a strong and durable connection between the tubing and end caps.

The polyethylene bag is disposed between rigid polystyrene boards which are bound together. The area surrounding the bound unit inside the PVC tube is filled with catalyst-responsive foam to provide additional shock absorption, thermal insulation and moisture proofing.

BRIEF DESCRIPTION OF THE DRAWINGS

Further objects, features and advantages of the present invention will become apparent upon consideration of one specific embodiment thereof especially when taken in conjunction with the accompanying drawings, wherein.

DESCRIPTION OF THE PREFERRED EMBODIMENT

Figures 1, 2, 2A, 3, 4, 4A, 5:
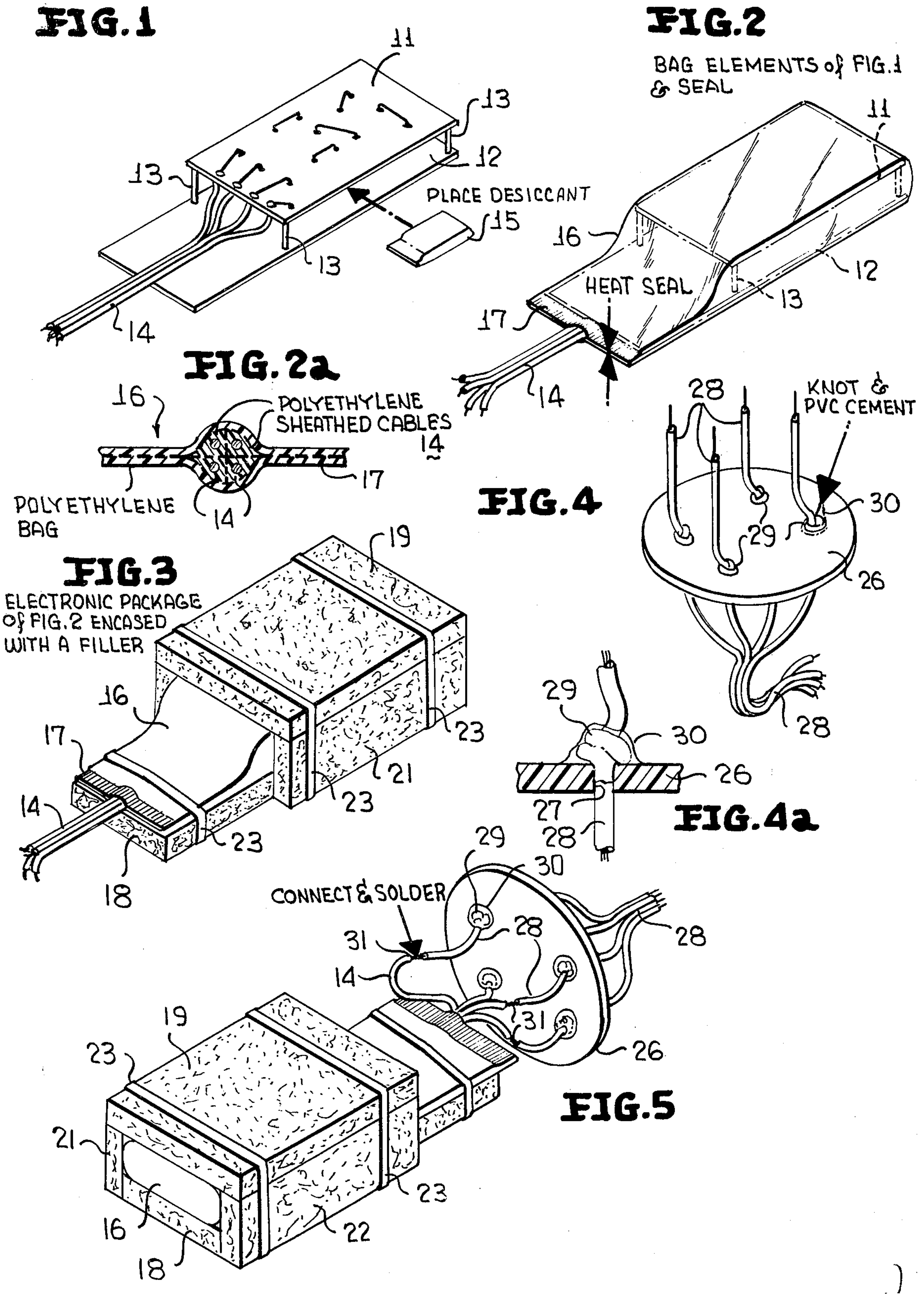
FIG. 1 is a view in perspective of an electronic circuit which is packaged according to the principles of the present invention.
FIG. 2 is a view in perspective of the circuit of FIG. 2 sealed in a polyethylene bag.
FIG. 2*a* is a view in section showing the seal at the polyethylene bag of FIG. 2.
FIG. 3 is a view in perspective illustrating the bag and circuit arrangement of FIG. 2 secured between polystyrene boards.
FIG. 4 is a view in perspective of an end cap for the package of the present invention, illustrating the manner in which wiring from the circuit of FIG. 1 extends therethrough.
FIG. 4*a* is a sectional view illustrating the manner in which the wiring in FIG. 4 is secured to the end cap.
FIG. 5 is a view in perspective showing the interconnection of the package portion of FIG. 3 having its external wiring connected to the wiring illustrated in FIG. 4.

Referring specifically to FIG. 1 of the accompanying drawings, the circuit to be packaged in accordance with the principles of the present invention is illustrated as being disposed on two printed circuit boards 11 and 12 which are assembled with components facing inward and spaced in fixed relationship by means of spacer bars 13. One of the circuit boards 12 is illustrated as being longer than the other; although this feature may have certain advantages with respect to protecting the wiring leads, it is by no means a necessary feature of the present invention. Individual wire leads 14 extend from the circuitry in the manner shown.

A small packet 15 of moisture-absorbing material, such as desiccant is disposed between the circuit boards 11 and 12. Any residual moisture remaining between the board after final package assembly is absorbed by packet 15.

Referring to FIG. 2, the circuit board assembly of FIG. 1 is illustrated as being enclosed in a polyethylene bag 16. Wire leads 14 extend out through the end 17 of the bag which is heat sealed along its edges and about the wire leads. This heat sealing about wire leads 14 is best illustrated in FIG. 2*a.* The shielding about wire leads 14 is polyethylene, the same basic material of bag 16. Upon being heat sealed the bag and wire shielding, both made of the same material, join together to provide a reliable moisture-proof seal. Although shown in FIG. 2*a* joined together, each wire lead 14 may be brought out of the bag separately and heat sealed at their respective spaced egress points.

Referring to FIG. 3, the sealed polyethylene bag 16 is disposed between two polystyrene boards 18 and 19 which are light weight and rigid. Additional polystyrene boards 21 and 22 may be placed along side plastic bag 16 as illustrated in FIG. 3; however side boards 21 and 22 are optional features. The function of the polystyrene boards is to provide a rigid protective shell about the bag-enclosed circuit boards 11 and 12. The sub-assembly illustrated in FIG. 3 is then tied with lacing cord 23 around the outside of the polystyrene boards to hold the entire sub-assembly together.

Referring to FIG. 4 of the accompanying drawings there is illustrated an end cap 26 for the exterior package of the present invention. End cap 26 is in the form of a flat circular disk made from polyvinylchloride (PVC). A plurality of egress holes 27 are defined through end cap 26 and are best illustrated in FIG. 4*a.* Wire leads 28, which are intended to connect to equipment external to the package of the present invention, extend through holes 27. Proximate the inside surface of end cap 26, leads 28 are knotted at 29. Knots 29 are sufficiently large to prevent leads 28 from being pulled back out through holes 27. The knots are joined to the inside surface of end cap 26 by means of PVC cement 30 which serves both to secure the knot to the inside surface of the end cap and to seal holes 27 against moisture.

As an alternative to knotting leads 28, the PVC shield can be molded onto the lead at the outer surface of end cap 26 in such a manner as to form a generally conical configuration. The base of the conical form would be adjacent the end cap and would remain substantially rigid, whereas the narrower tapered portion would be somewhat flexible. This expedient prevents loosening or breaking of the leads as might occur if they are bent at the point of egress from the end cap.

Referring to FIG. 5, the leads 14 from the sub-assembly of FIG. 3 are shown connected to the leads 28 from end cap 26 in FIG. 4. Specifically, the polyethylene shielded leads 14 are spliced and soldered at 31 to the PVC-shielded leads 28. The change in shielding between leads 14 and leads 28 constitutes an important aspect of the present invention. Specifically, leads 14 are shielded with the same material comprising bag 16. On the other hand leads 28 are shielded with the same material comprising end cap 26. If the same shielding were utilized for the entire length of wire, either the heat seal at the egress 17 of plastic bag 16, or the joint at output holes 27 in end cap 26 would be less reliable and durable. More particularly, the heat seal at end 17 of plastic bag 16 joins the polyethylene shielding and polyethylene bag together; since both materials are the same, there is no difference in the thermal coefficient of expansion and the heat seal remains integral over wide range of temperatures. Likewise, the use of PV shielding for leads 28 permit the use of PVC cement 30 to join knot 29 to end cap 26 and thereby provide a joint in which all materials have the same thermal coefficient of expansion. In addition, the similar materials at the joints render the joints more resistant to shock and vibration damage.

Figures 6, 7, 8, 9:
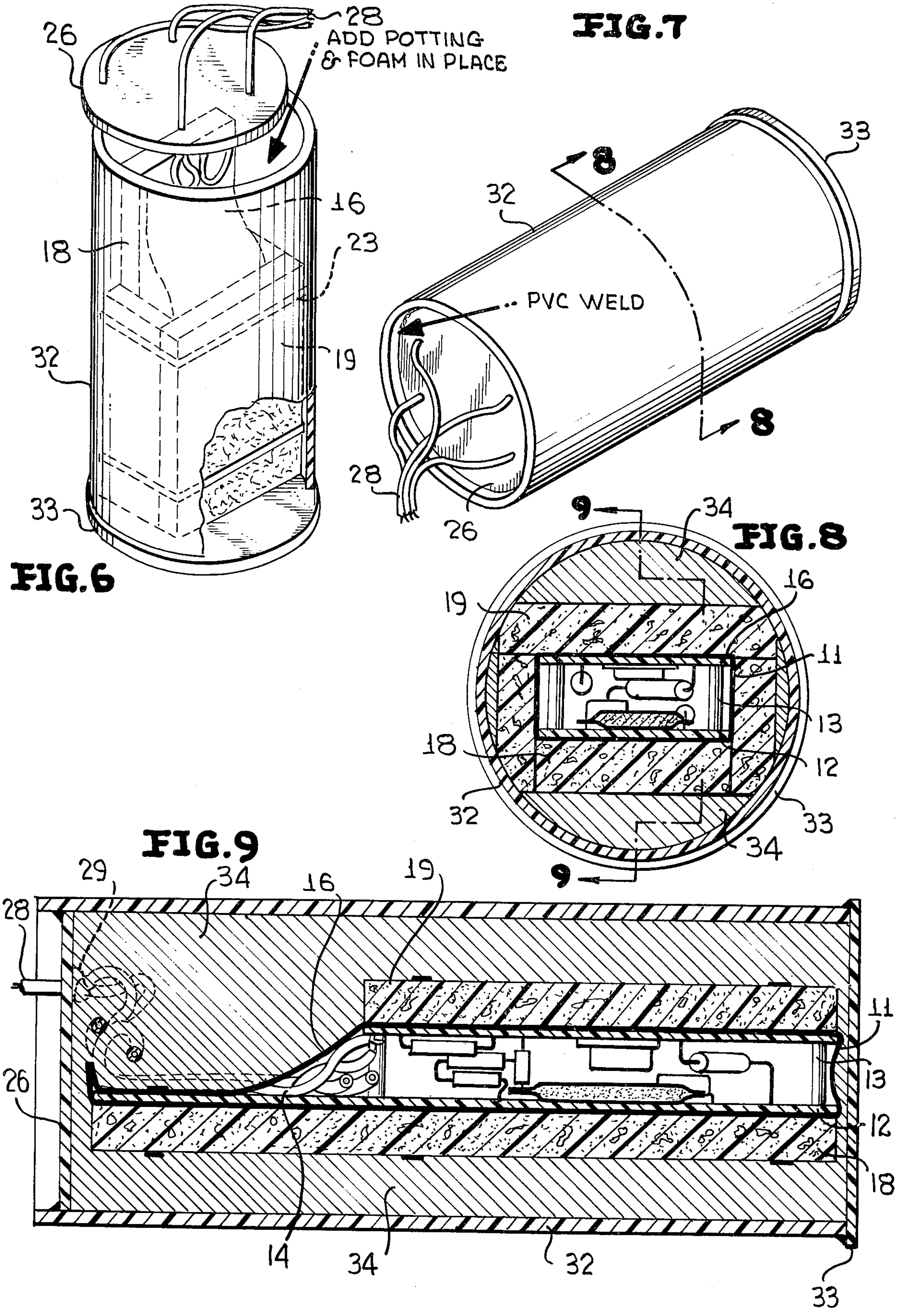
FIG. 6 is a partially cut away, partially phantom view in perspective of the package assembly of the present invention showing the location of the sub-assembly of FIG. 3 inside the exterior package walls.
FIG. 7 is an external view in perspective of the package assembly of the present invention.
FIG. 8 is a sectional view taken along lines 8—8 of FIG. 7.
FIG. 9 is a sectional view taken along lines 9—9 of FIG. 8.

Referring to FIG. 6, the package sub-assembly illustrated in FIg. 3 is shown inserted into a PVC tube 32. Tube 32 is generally cylindrical in configuration and includes a generally circular bottom end 33 which is slightly larger in diameter than the outside diameter of tube 32. Bottom end 33 is secured to tube 32 by means of a PVC weld which is effected with a hot air torch and a PVC welding rod. Again, this utilization of PVC welding material to join together two PVC components provides for a reliable and highly durable moisture resistant connection.

The empty space inside tube 32 is filled with a catalyst-responsive foam which serves as a shock absorbent material between the internal package and the interior walls of tube 32. Catalyst-responsive foams are well known for this purpose; a typical such foam is manufactured by Emerson and Cuming, Inc. of Canton, Massachusetts as part No. FP2 and utilized with a catalyst designated 12-2. The foam is generally designated by the numeral 34 in FIGS. 8 and 9 of the accompanying drawings.

After the tube 32 is filled with foam 34, end cap 26 is sealed to the top end of the tube. Specifically, as best illustrated in FIG. 7, end cap 26 has a diameter which is the same as the inside diameter of tube 32. The end cap is inserted approximately one-eighth inch into tube 32 and sealed to the inside wall of the tube by means of a PVC weld.

The interior of the completed package is illustrated in FIGS. 8 and 9. It is noted that the circuitry is disposed between circuit boards 11 and 12 and protected from shock by both the rigid polystyrene boards 18 and 19 and the semi-rigid foam 34. Of course if the circuitry is disposed on a single circuit board, or on some other single component, the function of spacers 13 would ordinarily be replaced by spacers extending between the two polystyrene boards. As best noted from FIG. 9, circuit board 12 extends almost the entire length of tube 32. As mentioned above, this provides support for wiring leads 14 but is not a necessary feature of the present invention. For example, if board 13 were foreshortened relative to end cap 26, it would be possible to saw through tube 32 at a location between end cap 26 and the end of board 12. This would permit access to the circuit components for purposes of repair and/or adjustment. In such case, after sawing through the tube, the entire interior of the package is removed from the tube. This removal is facilitated in the interior wall of tube 32 is coated with a lubricant, such as grease, wax, etc., during the initial fabrication process prior to inserting the catalyst-responsive foam 34 into the tube. Once the removed components are repaired the package can be reassembled as described above in relation to FIGS. 1 through 7, it being noted that the package for the repaired unit would be somewhat shorter than the package as originally fabricated.

Alternatively, the PVC weld which joins end cap 33 to the tube can be ground off to provide interior access without shortening the tube. The unit can then be removed from the tube, assuming of course that sufficient slack is provided in leads 28 for this purpose.

Another important aspect of the present invention is that the package does not require any special wrapping or external insulation for shipping.

In a typical embodiment of the present invention, the originally fabricated package is approximately 15⅛ inches long by approximately 5⅛ inches outside diameter. Polystyrene boards 18 and 19 are ⅜ inch thick and the polyethylene bag 16 is 7 mils thick. The wall of tube 32 is approximately ¼ inch in thickness and end caps 26 and 32 are approximately ⅛ inch thick.

Still another advantage of the present invention relates to the use of foam filler 34 rather than air to surround the interior package. If air were used it would tend to greatly expand and contract with temperature changes. If a minute pin hole is present in the cylinder wall, expanding heated air would be issued out through the pin hole during the day and moisture-laden cool air would be sucked into the package through the pin hole at night. The moisture in the air would condense inside the package and, after many days, would eventually accumulate to a significant volume of water inside the package. Foam filler 34 eliminates the bellows-type cycle and thereby avoids this type of moisture accumulation in the package. Moreover, since the foam 34 has a relatively low temperature coefficient of expansion it exerts little if any expansive force on the package in the presence of high temperature; an air filler, on the other hand, could conceivably expand sufficiently in response to heat so as to rupture the package.

It should also be pointed out that the polyethylene bag 16 serves not only to moisture proof the circuitry but also to prevent the catalyst-responsive foam 34 from getting all over the circuit components during expansion of the foam. Similarly, an additional function of the rigid boards 18 and 19 is to prevent the expanding foam 34 from puncturing the bag 16 on sharp edges of the printed circuit boards.

While I have described and illustrated one specific embodiment of my invention, it will be clear that variations of the details of construction which are specifically illustrated and described may be resorted to without departing from the true spirit and scope of the invention as defined in the appended claims.

I claim:

1. A ruggedized weather proof component package comprising:

a hollow polyvinylchloride casing sealed at its joints by a polyvinylchloride weld;

an integral sub-assembly including a polyethylene bag disposed inside said casing, said bag being heat sealed and containing the packaged components; and plastic material disposed inside said casing and filling the volume therein which is unoccupied by said integral sub-assembly;

wherein the components being packaged include electrical apparatus which requires wire leads to be passed from inside said polyethylene bag to outside said package, said package further comprising:

polyethylene shielding about the wire leads extending through said polyethylene bag, said polyethylene shielding being heat sealed to said bag at the point of passage therethrough.

2. The package according to claim 1 wherein said wire leads are knotted externally of said bag at a location proximate the interior surface of said casing before extending through suitably provided openings in said casing, the knotting being larger than said openings.

3. The package according to claim 2 wherein the knotted portions of said wire leads are adhesively secured to the interior surface of said casing with polyvinylchloride cement of sufficient quantity to seal the openings in said casing.

4. The package according to claim 3 wherein the knotted portions of said wire leads and the wire lead portions extending through said openings are shielded with polyvinylchloride.

5. The package according to claim 4 wherein said electrical apparatus comprises a circuit disposed on two printed circuit boards mounted in parallel spaced relation, said package further comprising at least two light weight rigid board members forming part of said integral sub-assembly and disposed outside said polyethylene bag adjacent and parallel to respective printed circuit boards.

6. A ruggedized weather proof component package comprising:

a hollow polyvinylchloride casing sealed at its joints by a polyvinylchloride weld;

an integral sub-assembly including a polyethylene bag disposed inside said casing, said bag being heat sealed and containing the packaged components; and plastic material disposed inside said casing and filling the volume therein which is unoccupied by said integral sub-assembly;

wherein the components being packaged include electrical apparatus which requires wire leads to be passed from said apparatus to outside said package through suitably provided openings in said casing, said package further comprising:

polyvinylchloride shielding for at least the portions of the wire leads which pass through said openings, the polyvinylchloride-shielded portions of said wire leads being knotted inside said casing proximate said openings, said knotting being larger than said openings to prevent removal of said wire leads from said apparatus by pulling on said wire leads from outside said casing;

wherein said knotted polyvinylchloride-shielded portions of said wire leads are adhesively secured to the interior surface of said casing at said openings by polyvinylchloride cement in sufficient quantity to seal said openings about said wire leads.

7. A ruggedized weather proof component package comprising:

a hollow polyvinylchloride casing sealed at its joints by a polyvinylchloride weld;

an integral sub-assembly including a polyethylene bag disposed inside said casing, said bag being heat sealed and containing the packaged components;

plastic material disposed inside said casing and filling the volume therein which is unoccupied by said integral sub-assembly;

wherein the components being packaged include electrical apparatus which requires wire leads to be passed from said apparatus to outside said package through suitably provided openings in said casing; and means for sealing said openings in said casing about said wire leads while securing said wire leads to said casing.

8. The package according to claim 7 further comprising:

polyvinylchloride shielding for at least the portions of the wire leads which pass through said openings, the polyvinylchloride-shielded portions of said wire leads being knotted inside said casing proximate said openings, said knotting being larger than said openings to prevent removal of said wire leads from said apparatus by pulling on said wire leads from outside said casing.

9. The package according to claim 8 wherein said means for sealing includes polyvinylchloride cement filling said openings in said casing about said wire leads and said knotting.

* * * * *